United States Patent
Mirpuri

(10) Patent No.: US 10,037,898 B2
(45) Date of Patent: Jul. 31, 2018

(54) WATER SOLUBLE FLUX WITH MODIFIED VISCOSITY

(71) Applicant: Intel Corporation, Santa Clara, CA (US)

(72) Inventor: Kabir J. Mirpuri, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/089,208

(22) Filed: Apr. 1, 2016

(65) Prior Publication Data

US 2017/0287732 A1    Oct. 5, 2017

(51) Int. Cl.
*H05K 1/18*     (2006.01)
*H05K 1/11*     (2006.01)
(Continued)

(52) U.S. Cl.
CPC ...... *H01L 21/4864* (2013.01); *B23K 35/3613* (2013.01); *H01L 21/4853* (2013.01); *H01L 23/49816* (2013.01); *H05K 1/181* (2013.01); *B23K 2201/40* (2013.01); *B23K 2201/42* (2013.01); *H01L 23/488* (2013.01);
(Continued)

(58) Field of Classification Search
CPC .... H05K 1/021; H05K 1/0212; H05K 1/0215; H05K 1/023; H05K 1/0231; H05K 1/0233; H05K 1/0234; H05K 1/0243; H05K 1/0295; H05K 1/14; H05K 1/141; H05K 1/142; H05K 1/144; H05K 1/145; H05K 1/16; H05K 1/162; H05K 1/18; H05K 1/181; H05K 1/182; H05K 1/183; H05K 1/184; H05K 1/185; H05K 2201/0317; H05K 2201/041; H05K 2201/049; H05K 2201/09763; H05K 2201/09872; H05K 2201/10446; H05K 2201/10454; H05K 2201/1046; H05K 2201/10477; H05K 2201/10484; H05K 2201/10492; H05K 2201/105; H05K 2201/10674; H05K 3/30; H05K 3/32; H05K 3/341; H05K 3/3415; H05K 3/3421; H05K 3/3431; H05K 3/36; H05K 3/46

See application file for complete search history.

(56) References Cited

U.S. PATENT DOCUMENTS

| | | | |
|---|---|---|---|
| 5,615,827 A * | 4/1997 | Arldt | B23K 35/3612 106/311 |
| 2003/0201309 A1* | 10/2003 | Grigg | B23K 1/203 228/207 |

(Continued)

OTHER PUBLICATIONS

International Search Report and Written Opinion dated Jun. 7, 2017 for International Application No. PCT/US2017/020407, 14 pages.

*Primary Examiner* — Ishwarbhai B Patel
(74) *Attorney, Agent, or Firm* — Schwabe, Williamson & Wyatt, P.C.

(57) ABSTRACT

A one-step water soluble (WS) flux process may reduce residue staining and increase yields for bond grid array (BGA) packages. In one example, the WS flux may use increased amounts of bonding polymer (BP) and reduced amounts of amine to increase viscosity. The increased viscosity may eliminate using a second no-clean flux and enable a single WS flux to both clean the associated substrate and provide stable solder ball support during reflow.

7 Claims, 9 Drawing Sheets

(51) Int. Cl.
    *H01L 21/48*     (2006.01)
    *H01L 23/498*     (2006.01)
    *B23K 35/36*     (2006.01)
    *B23K 101/40*     (2006.01)
    *H01L 23/488*     (2006.01)
    *B23K 101/42*     (2006.01)

(52) U.S. Cl.
    CPC .............. *H01L 2225/06513* (2013.01); *H01L 2225/06517* (2013.01); *H05K 1/11* (2013.01); *H05K 2201/10462* (2013.01); *H05K 2201/10674* (2013.01)

(56) References Cited

U.S. PATENT DOCUMENTS

| | | | | |
|---|---|---|---|---|
| 2004/0224865 | A1* | 11/2004 | Roeder | C11D 1/004 510/175 |
| 2006/0091184 | A1* | 5/2006 | Bayot | B23K 1/06 228/110.1 |
| 2006/0231162 | A1* | 10/2006 | Swidersky | B23K 1/19 148/25 |
| 2009/0226630 | A1 | 9/2009 | Bae | |
| 2011/0237065 | A1 | 9/2011 | Kawashiro | |
| 2012/0217289 | A1* | 8/2012 | Lee | B23K 1/0016 228/223 |
| 2012/0217290 | A1* | 8/2012 | Lee | B23K 35/3601 228/224 |
| 2012/0248599 | A1* | 10/2012 | Ring | H01L 24/13 257/737 |
| 2013/0001279 | A1 | 1/2013 | Lee et al. | |
| 2014/0084461 | A1* | 3/2014 | Sidhu | B23K 35/3612 257/738 |
| 2014/0175160 | A1* | 6/2014 | Sidhu | B23K 1/0016 228/224 |
| 2014/0321093 | A1 | 10/2014 | Pande et al. | |
| 2016/0311066 | A1* | 10/2016 | Garcia-Juan | B23K 35/284 |

\* cited by examiner

WATER SOLUBLE FLUX WITH MODIFIED VISCOSITY

TECHNICAL FIELD

The present disclosure relates generally to the field of solder joints, and more specifically to flux for improving solder joints.

BACKGROUND

Finishes on ball grid array (BGA) bond pads changed from nickel to copper. The copper finishes tend to oxidize. A thin organic layer of organic solderability preservative (OSP) may be applied to the copper bond pad to prevent oxidation. The OSP bonds to the bond pad surface and protects the copper until soldering. However, cleaning copper OSP may be difficult due to upstream in-process contaminants.

BGAs may use a two-step reflow process to form a ball attach joint. The first step involves cleaning the OSP layer atop the underlying copper bond pad. A first step may print and reflow water soluble (WS) flux over the bond pad. Water jets then may wash the WS flux residue off the bond pad surface during the deflux process which immediately follows the first step. A second step may apply a no clean (NC) flux to the cleaned bond pad surface during a ball attach (BA) operation. The NC flux retains the solder ball and improves wetting during solder ball reflow leading to formation of the actual BGA joint.

Residue from the BA process may stain a second level interconnect (SLI) interface of the BGA package. The residue may be a remnant of the NC flux spreading out over the bond pad. Cosmetic defects from the residue may result in final visual inspection (FVI) rejections.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

A one-step water soluble (WS) flux process may reduce residue staining and increase yields for bond grid array (BGA) packages. In one example, the WS flux may use increased amounts of bonding polymer (BP) and reduced amounts of amine to increase viscosity. The increased viscosity may eliminate a second no-clean flux stage and enable a single WS flux to both clean the associated substrate and provide stable solder ball support during reflow.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

In various embodiments, the phrase "a first layer formed on a second layer" may mean that the first layer is formed over the second layer, and at least a part of the first layer may be in direct contact (e.g., direct physical and/or electrical contact) or indirect contact (e.g., having one or more other layers between the first layer and the second layer) with at least a part of the second layer.

Figure 1:
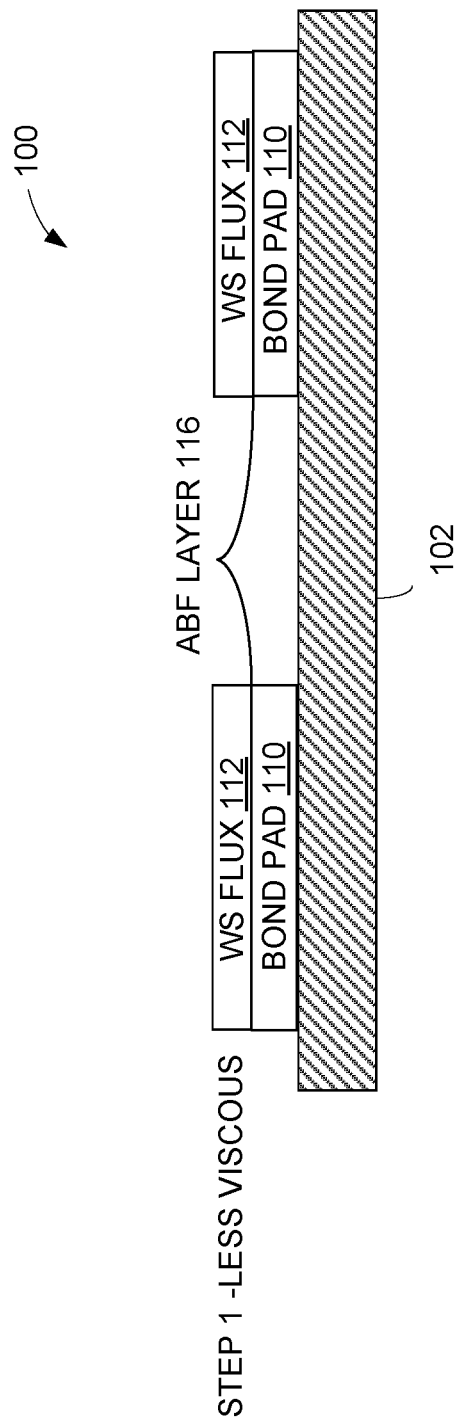
FIG. 1 shows a first step of a two-step BGA flux process.

FIG. 1 shows a first step of a two-step flux process. In one example, a ball grid array (BGA) package 100 may include a substrate 102 with multiple bond pads 110. A first water soluble (WS) flux 112 may be applied to clean an ajinomoto buildup film (ABF) layer 116 on bond pads 110. In one example, WS flux 112 may be non-rosin based and may include acid, amine, thixotropic material (bonding polymer) and solvent. WS flux 112 may be washed off with water after soldering. For example, after flux reflow, water jets may wash WS flux 112 off of ABF 116.

Figure 2:
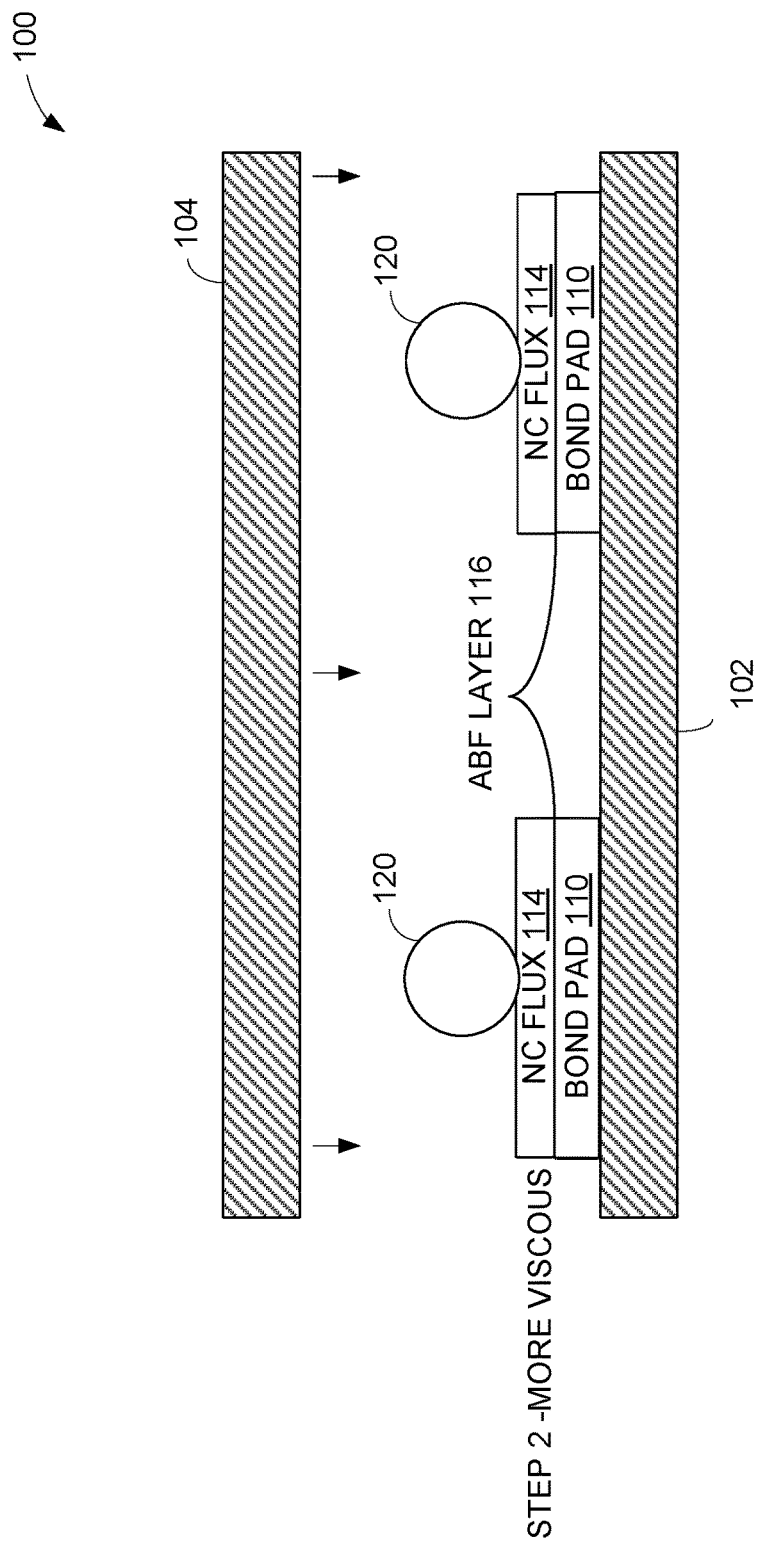
FIG. 2 shows a second step of the two-step BGA flux process.

FIG. 2 shows a second step of the two-step flux process. The second step may apply a second more viscous no-clean (NC) flux 114 on bond pads 110. No-clean flux 114 may not need to be removed after soldering due to a non-conductive and non-corrosive residue. However, the NC flux residue is often plainly visible post reflow. In one example, NC flux 114 may be rosin based and include gum rosin, acid, amine, thixotropic material, polymer, activator, surfactant, solvent, etc. Multiple solder balls 120 may be placed on NC flux 144. A reflow process may heat solder balls 120 and/or BGA package 100. Solder balls 120 and NC flux 114 melt and spread over bond pads 110. After reflow, a second substrate 104 may be placed over solder balls 120 forming one or more joints between substrate 102 and substrate 104.

Figure 3:
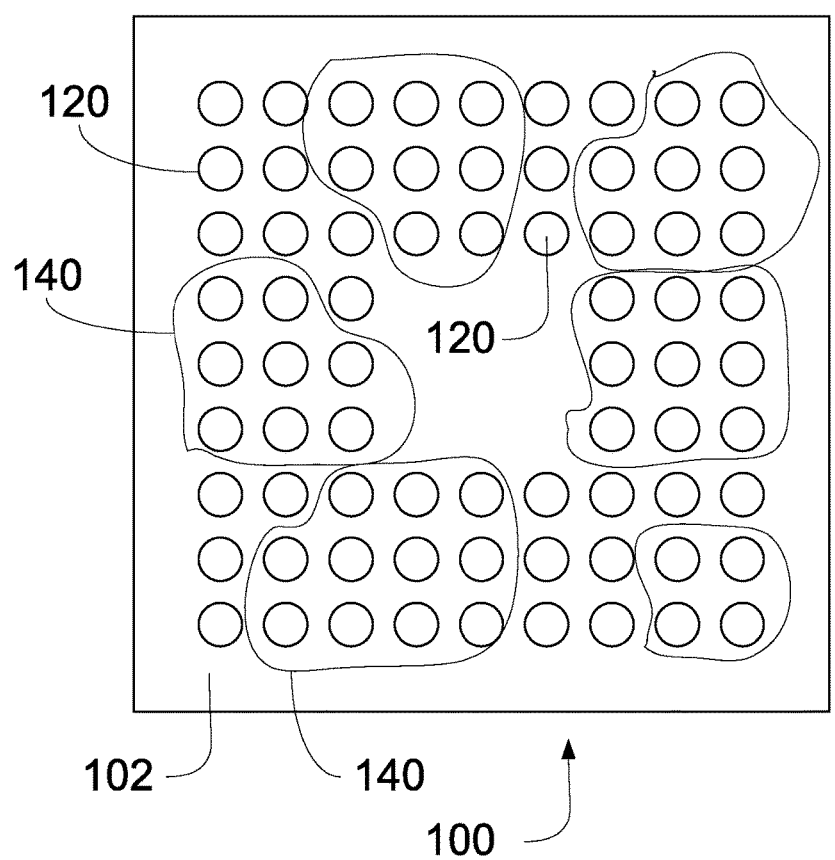
FIG. 3 shows example residue formed during the two-step BGA flux process.

FIG. 3 shows an example top view of BGA package 100 after the two step reflow process described above in FIGS. 1 and 2. A residue 140 from the NC flux may extend out over a top surface of substrate 102 around different groups of solder balls 120. Residue 140 may lead to final visual inspection (FVI) rejection of BGA package 100.

Referring to FIGS. 1-3, two factors may influence spread characteristics of NC flux 114. From the substrate side, the spread of flux 114 may depend on Ajinomoto build-up film (ABF) layer 116. For example, newer types of ABF 116 may be more prone to increase flux spread.

From the materials side, higher wettability of WS flux 112 also may increase spreading of NC flux 114 and create larger areas of flux residue staining 140. For example, wetting of WS flux 112 with both ABF 116 and metal bond pad 110 may considerably increase surface energy of substrate 102. The increased surface energy from the pre-clean process may increase residue spreading by NC flux 114 post step-2 reflow.

Viscosity of fluxes 112 and 114 are compared in table 1.0. WS flux 112 may generally have a lower viscosity than NC flux 114. The lower viscosity WS flux 112 may tend to spread a greater degree than higher viscosity NC flux 114. The higher viscosity of NC flux 114 also may lead to lower spread over bond pads 110.

TABLE 1.0

| Flux | Viscosity (Pa · s) |
|---|---|
| WS 112 | 10-30 |
| NC 114 | 100-200 |

Figure 4:
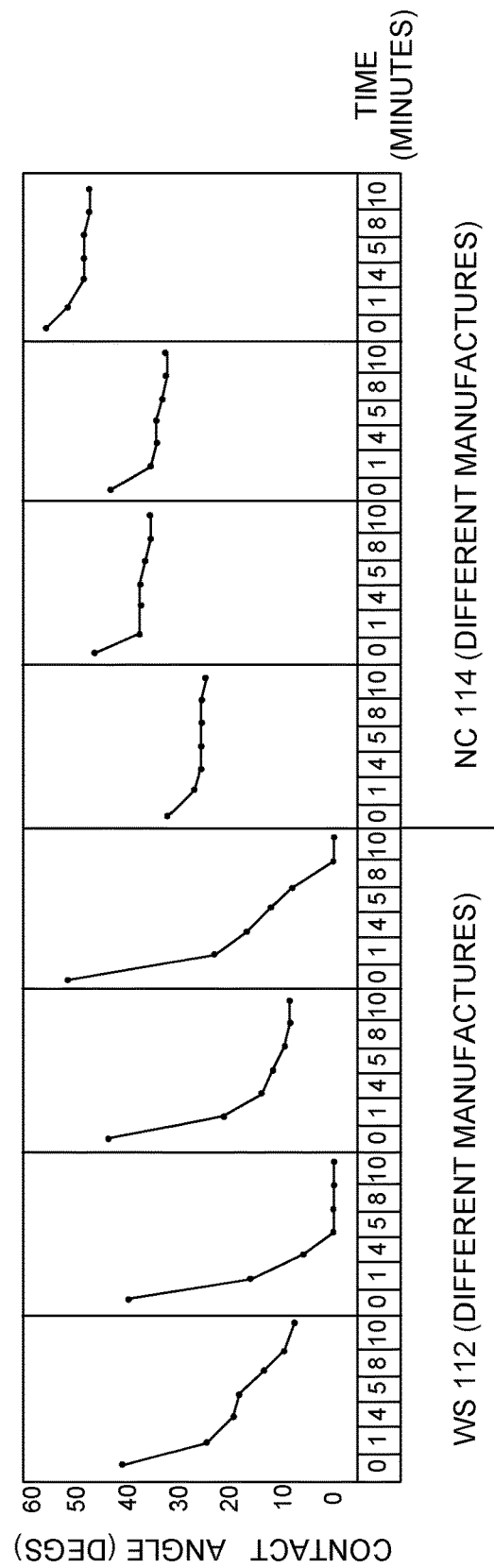
FIG. 4 shows example contact angles measurements for different water soluble and no-clean fluxes.

FIG. 4 shows example contact angle measurements for WS flux 112 and NC flux 114 for different manufactures. The contact angle may be the angle formed between a substrate and the applied flux. As shown in FIG. 4, the contact angles for WS flux 112 may generally be lower than the contact angles for NC flux 114.

Other rheological behaviors of fluxes 112 and 114 were discovered through a joint electron device engineering counsel (JEDEC) slump test. The slump test printed flux 112 and 114 through various apertures of decreasing sizes and pitches to determine lowest pitch distances creating overlap. Flux withstanding overlap between the narrowest adjacent apertures may indicate more spread resistance. It was discovered that WS flux 112 may have poorer rheology compared with NC flux 114 in terms of spread characteristics.

A higher viscosity flux may spread less and reduce residue staining. For example, residue staining post reflow might be lower when NC flux 114 is applied directly on substrate 102 without the first pre-clean treatment with WS flux 112. However, NC flux 114 may not sufficiently clean ABF layer 116. A one-step flux process using only less viscous WS flux 112 may not sufficiently support solder balls 120 during reflow.

WS flux 112 may have around two times more amine than NC flux 114. The additional amine also may modify a surface energy of WS flux 112, lowering the contact angle and increasing wettability to surfaces.

Figure 5:
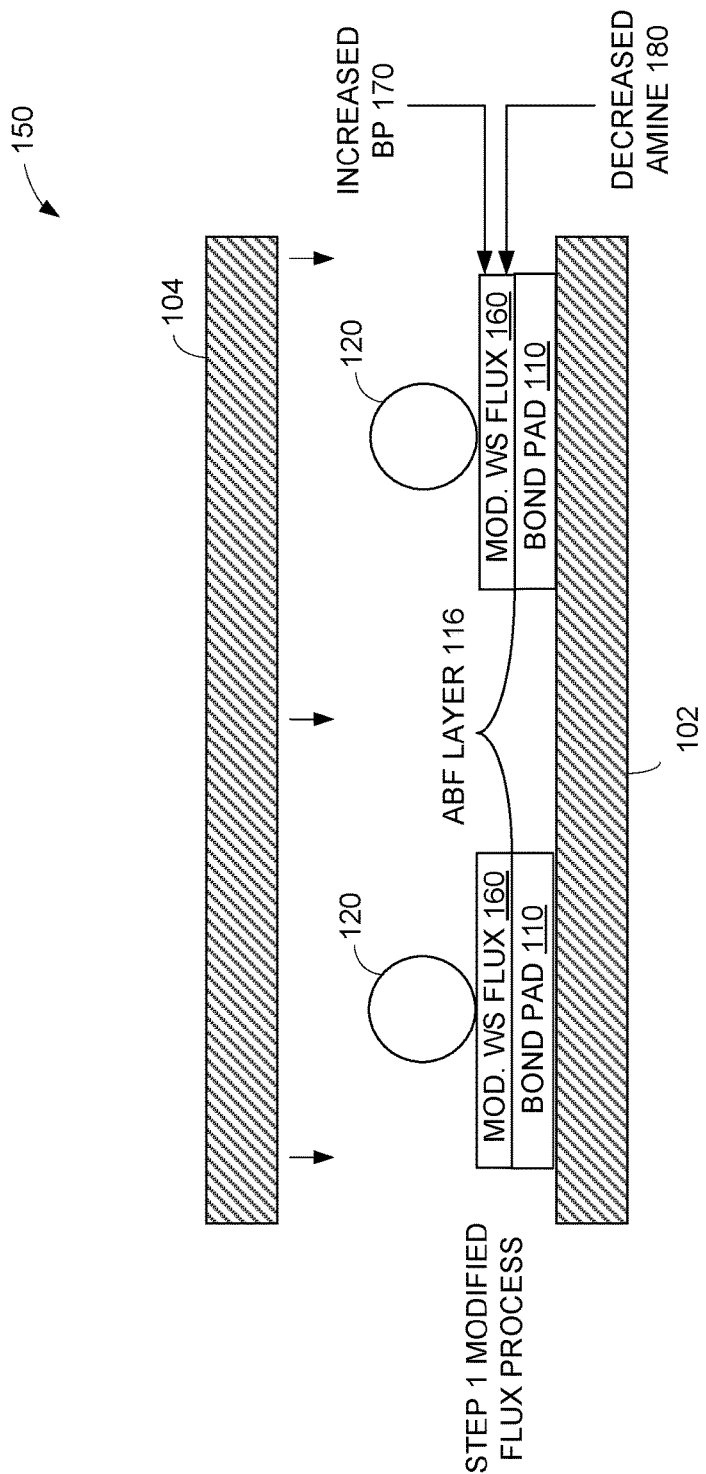
FIG. 5 shows an example BGA package formed using a one-step water soluble flux process.

FIG. 5 depicts an example BGA package 150 that uses a 1-step WS flux process. A water soluble (WS) flux 160 may be non-rosin based and may include base materials, such as, acid and solvent. WS flux 160 also may include amine 180 and a thixotropic material (bonding polymer) 170. Compared with other WS fluxes, WS flux 160 may include a lower amount of amine 180 and a larger amount of BP 170.

Modulating or adjusting amounts of amine 180 and BP 170 may increase the viscosity of WS flux 160 while also leading to lower spread on the ABF layer as manifested through higher contact angle measurements. The increased viscosity and S/C energy may cause WS flux 160 to spread over bond pad 110 while at the same time support solder balls 120 during reflow.

WS flux 160 may include more BP 170 than amine 180. For example, WS flux 160 may use around 15-20% by weight BP 170 and use around 5%-15% by weight amine 180. In one example, WS flux 160 may have a ratio of amine 180 to BP 170 of between 0.25 and 0.9. In another example, it was discovered that using around 10% amine 180 and around 17% BP 170 may provide a viscosity with good wetting of bond pad 110 and at the same time good support of solder balls 120 during ball attach and reflow.

Modifications to the amounts of BP 170 and amine 180 may increase the viscosity of WS flux 160 by around 2-3 times compared with existing WS fluxes. For example, WS flux 160 may have a viscosity of between 30-100 pascal-second (Pa.s). The higher viscosity WS flux 160 also may provide better spread resistance.

WS flux 160 may use around half as much amine and use around 1-3% more bonding polymer than existing WS fluxes. Of course WS flux 160 may use other percentages of BP 170 and amine 180. Varying the amounts and/or ratios of BP 170 and amine 180 may provide other viscosity, wetting, surface energy, and minimum pitch overlay characteristics suited for other packaging environments.

WS flux 160 may include known base materials, such as around 55%-75% solvent and a remaining amount including acid. The solvent, such as glycol, may act as a dissolution agent for the other materials. All of the materials referred to above, and the process for combining the materials together to form WS flux 160, are known to those skilled in the art and are therefore not describe in further detail.

In one example, a second substrate 104 may include materials similar to substrate 102. One or both of substrates 102 and/or 104 may include one or more pads, traces, and/or vias 110 that pass electrical signals through solder balls 120 between substrate 102 and substrate 104. In some examples, substrates 102 and 104 may form part of a processor, a server processor, a dynamic random access memory (DRAM), a package on package (PoP), or any other type of BGA package. In another example, substrates 102 and 104 may form part of a printed circuit board (PCB), such as a motherboard, an interposer, or some other type of package.

Figure 6:
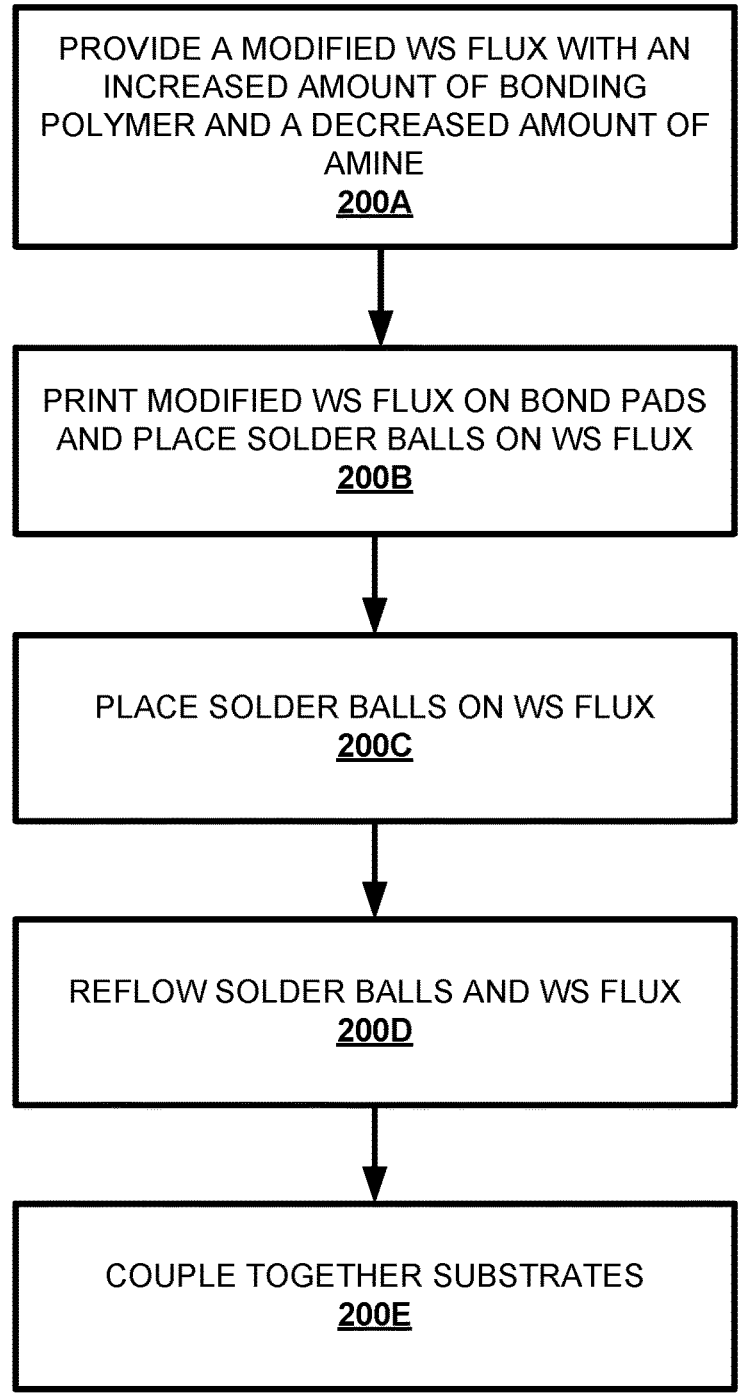
FIG. 6 shows an example one-step flux process for forming a BGA package.

FIG. 6 shows an example process for forming a BGA package using the modified WS flux 160 and one-step flux process described above in FIG. 5. Operation 200A may use a modified WS flux is described above. For example, the WS flux may include around 17% BP and around 10% amine to increase viscosity.

Operation 200B may perform a one-step flux process where the modified WS flux is applied to bond pads. For example, a template may be placed over the substrate and the WS flux printed through apertures onto the bond pads. Operation 200C may place the solder balls on the WS flux. The WS flux may have sufficient viscosity and surface tension to both spread over the bond pads while at the same time support the solder balls in a substantially stable position on top of the bond pads.

Operation 200D may reflow the WS flux and solder balls. For example, operation 200D may apply heat to the substrate, bond pads, WS flux, and/or solder balls 120. The WS flux may melt and wet the bond pads and solder balls may melt and form connections with the bond pads. Operation 200E may couple together different substrates. For example, an upper substrate may be placed on top of the solder balls forming electrical connections between bond pads on a lower substrate and corresponding bond pads on the upper substrate.

Figure 7:
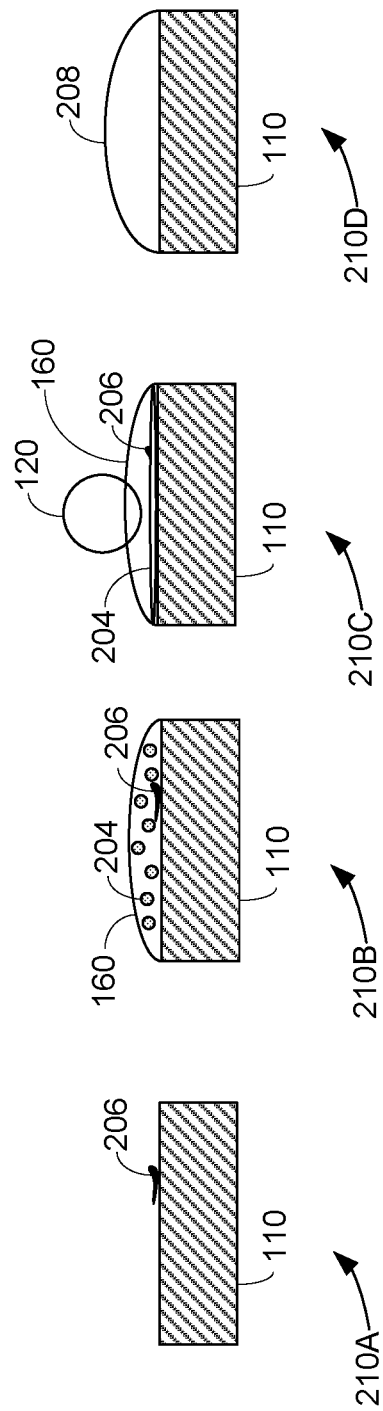
FIG. 7 shows an example one-step flux process using a low metal loaded (LML) water soluble (WS) flux.

FIG. 7 shows a WS flux with low metal loading (LML). LML may not work well with conventional low viscosity WS fluxes. For example, metal powder may separate from the WS flux. However, the increased viscosity of WS flux 160 may sufficiently retain the metal powder during reflow. Thus, in one example, WS flux 160 may include solder particles 204 typically varying in diameter from 1 to 50 microns. In one example, WS flux 160 may include around 20% by weight (wt %) or more of solder particles 204. A combination of other materials in WS flux 160 are then reduced by around 20% or more.

Solder particles 204 may reduce failures created during ball attach. For example, a foreign material 206 may sit on bond pad 110 during a pre-flux stage 210A. A second flux stage 210B may apply WS flux 160 with solder particles 204 to bond pad 110.

A third stage 210C may place solder ball 120 on top of WS flux 160. The increased viscosity of WS 160 may hold solder ball 120 in place above bond pad 102. Stage 210C may heat up bond pad 110, flux 160, and/or solder ball 120. WS flux 160 may have increased viscosity but may have sufficient surface energy to spread over bond pad 102. Solder particles 204 may melt and engulf foreign material 206. During reflow stage 210D, solder ball 120 may partially melt and spread out over bond pad 110.

Engulfing foreign material 206 with reflowed solder particles 204 may prevent the formation of partial non-wets on bond pad 110. In addition to reducing failures caused by foreign material 206 and partial non-wets, solder particles 204 also may increase ball placement yields by more securely holding solder ball 120 above bond pad 110 during reflow stages 210C and 210D.

Figure 8:
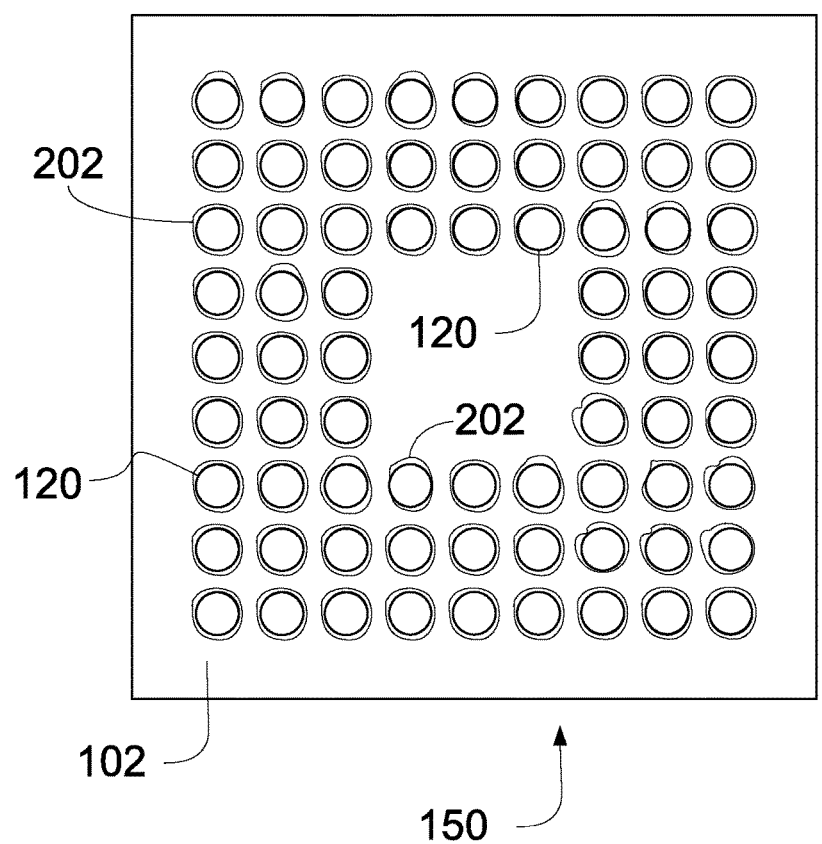
FIG. 8 shows an example top view of a BGA package formed using LML WS flux.

FIG. 8 shows a top view of BGA package 150 after the reflow process. Solder balls 120 may attach to a two dimensional array of bond pads on substrate 102. The solder particles in the WS solder may form metal rings 202 around perimeters of solder balls 120.

Compared with the two-step flux process in FIG. 3, the one-step flux process using the modified WS flux may no longer have residue from the NC-flux. Reduced residue on BGA package 150 may increase yields by reducing visual inspection (FVI) rejections.

Figure 9:
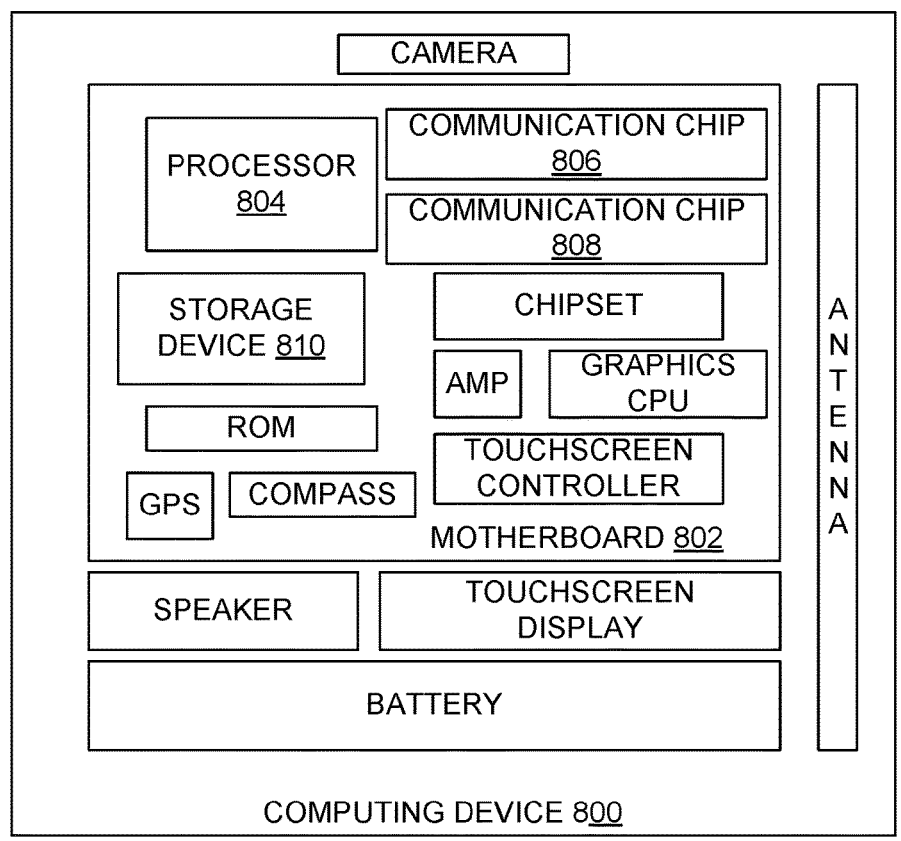
FIG. 9 shows an example computing device that may include the BGA package of FIG. 5.

FIG. 9 schematically illustrates a computing device 800, in accordance with some implementations, which may include one or more BGAs such as BGA package 150 in FIGS. 5, 7, and 8. For example, substrates 102 and/or 104 in FIG. 5 may include a storage device 810, a processor 804, and/or a communication chip 806 of the computing device 800 discussed below.

Computing device 800 may be, for example, a mobile communication device or a desktop or rack-based computing device. Computing device 800 may house a board such as a motherboard 802. In embodiments, motherboard 802 may be similar to substrate 102 in FIG. 5. Motherboard 802 may include a number of components, including (but not limited to) a processor 804 and at least one communication chip 806. Any of the components discussed herein with reference to computing device 800 may be arranged in or coupled with a BGA such as BGA package 150 as discussed herein. In further implementations, communication chip 806 may be part of the processor 804.

In some embodiments, storage device 810 may include one or more solid state drives. Examples of storage devices that may be included in the storage device 810 include volatile memory (e.g., dynamic random access memory (DRAM)), non-volatile memory (e.g., read-only memory, ROM), flash memory, and mass storage devices (such as hard disk drives, compact discs (CDs), digital versatile discs (DVDs), and so forth).

Depending on its applications, computing device 800 may include other components that may or may not be physically and electrically coupled to motherboard 802. These other components may include, but are not limited to, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, and a camera.

Communication chip 806 and the antenna may enable wireless communications for the transfer of data to and from computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not.

Communication chip 806 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wide region (BWA) networks are generally referred to as WiMAX networks, an acronym that stands for Worldwide Interoperability for Microwave Access, which is a certification mark for products that pass conformity and interoperability tests for the IEEE 802.16 standards.

Communication chip 806 may operate in accordance with a Global System for Mobile Communications (GSM), General Packet Radio Service (GPRS), Universal Mobile Telecommunications System (UMTS), High Speed Packet Access (HSPA), Evolved HSPA (E-HSPA), or LTE network. The communication chip 806 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN).

Communication chip 806 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. Communication chip 806 may operate in accordance with other wireless protocols in other embodiments.

Computing device 800 may include a plurality of communication chips 806. For instance, a first communication chip 806 may be dedicated to shorter range wireless communications such as Wi-Fi and Bluetooth, and a second communication chip 808 may be dedicated to longer range wireless communications such as GPS, EDGE, GPRS, CDMA, WiMAX, LTE, EV-DO, and others. In some embodiments, the communication chip 806 may support wired communications. For example, the computing device 800 may include one or more wired servers.

Processor 804 and/or communication chip 806 of computing device 800 may include one or more dies or other components in an IC package. Such an IC package may be coupled with an interposer or another package using any of the techniques disclosed herein. The term "processor" may refer to any device or portion of a device that processes electronic data from registers and/or memory to transform that electronic data into other electronic data that may be stored in registers and/or memory.

In various implementations, computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 800 may be any other electronic device that processes data. In some embodiments, the recessed conductive contacts disclosed herein may be implemented in a high-performance computing device.

The following paragraphs provide examples of various ones of the embodiments disclosed herein.

Example 1 may include a ball grid array (BGA) package, comprising: a substrate; a plurality of solder balls; and a water soluble (WS) flux on the substrate to promote connections between the substrate and the solder balls, wherein the WS flux includes around 5%-15% amine and 15%-20% bonding polymer.

Example 2 may include the BGA of example 1, wherein the substrate includes bond pads and the WS flux extends over the bond pads and supports the solder balls during reflow.

Example 3 may include the BGA of any of examples 1 and 2, wherein the WS flux is to clean the bond pads on an ajinomoto buildup film (ABF) layer.

Example 4 may include the BGA of any of examples 1-3, wherein the WS flux is the only flux applied to the bond pads.

Example 5 may include the BGA of any of examples 1-4, wherein the WS flux includes around 55-75% solvent and a remaining portion that includes acid.

Example 6 may include the BGA of any of examples 1-5, wherein the WS flux includes around 10% amine and around 17% bonding polymer.

Example 7 may include the BGA of any of examples 1-6, wherein the WS flux is loaded with around 20% or more solder particles.

Example 8 may include the BGA of any of examples 1-7, wherein the WS flux is non-rosin based.

Example 9 may include a method comprising: applying a water soluble (WS) flux to a bond pad, wherein an amount of bonding polymer (BP) in the WS flux is greater than an amount of amine in the WS flux; placing a solder ball on the WS flux; and reflowing the WS flux and the solder ball to form a connection between the bond pad and the solder ball.

Example 10 may include the method of example 9, including using the WS flux to clean the bond pad on an ajinomoto buildup film (ABF) layer and to retain the solder ball during the reflowing to form the connection.

Example 11 may include the method of any of examples 9 and 10, wherein the WS flux includes a ratio of amine to BP of between 0.25 and 0.9.

Example 12 may include the method of any of examples 9-11, wherein the WS flux includes around 17% BP and around 10% amine.

Example 13 may include the method of any of examples 9-12, wherein the WS flux is loaded with around 20% or more solder particles.

Example 14 may include the method of any of examples 9-13, further comprising applying only the WS flux to the bond pad in a one-step flux operation prior to reflowing the WS flux and the solder ball to form the connection.

Example 15 may include a water soluble (WS) flux, comprising: base materials; 5-15% amine; and 15-20% bonding polymer.

Example 16 may include the WS flux of example 15, wherein the base materials, amine and bonding polymer have a viscosity of around 30-100 pascal-second (Pa.s).

Example 17 may include the WS flux of any of examples 15 and 16, wherein the base materials include a solvent and acid.

Example 18 may include the WS flux of any of examples 15-17, including around 10% amine, 17% base polymer, and 55-75% solvent.

Example 19 may include the WS flux of any of examples 15-18, wherein the base materials are non-rosin based.

Example 20 may include the WS flux of any of examples 15-19, including around 20% or more solder particles, wherein a combination of the acid, amine, solvent and bonding polymer are reduced by around 20% or more.

Example 21 may include a flux, comprising: means for applying a water soluble (WS) flux to a bond pad, wherein an amount of bonding polymer (BP) in the WS flux is greater than an amount of amine in the WS flux; means for placing a solder ball on the WS flux; and means for reflowing the WS flux and the solder ball to form a connection between the bond pad and the solder ball.

Example 22 may include the flux of example 21, wherein the WS flux cleans the bond pad on an ajinomoto buildup film (ABF) layer and retains the solder ball during the reflowing to form the connection.

Example 23 may include the flux of any of examples 21 and 22, wherein the WS flux includes a ratio of amine to BP of between 0.25 and 0.9.

Example 24 may include the flux of any of examples 21-23, wherein the WS flux includes around 17% BP and around 10% amine.

Example 25 may include the flux of any of examples 21-24, wherein the WS flux is loaded with around 20% or more solder particles.

Example 26 may include the flux of any of examples 21-25, the WS flux is the only flux applied to the bond pad in a one-step flux operation prior to reflowing the WS flux and the solder ball to form the connection.

What is claimed is:
1. A ball grid array (BGA) package, comprising:
   a substrate; a plurality of bond pads disposed on the substrate, wherein at least some of the bond pads have foreign material present on top surfaces of the bond pads at a pre-flux stage;
   a water soluble (WS) flux disposed on the bond pads; and
   a plurality of solder balls disposed on respective bond pads with the WS flux,
   wherein the WS flux is to promote connections between the bond pads and the solder balls,
   wherein the WS flux includes around 5%-15% amine and 15%-20% bonding polymer, and 55%-75% solvent, wherein the WS flux further includes around 20% by weight of solder particles,
   wherein the solder particles are melted in response to reflow, to engulf the foreign material present on the top surfaces of the at least some of the bond pads, and the melted solder particles form metal rings around perimeters of respective solder balls and securely hold solder balls above respective bond pads.

2. The BGA of claim 1, wherein the WS flux extends over the bond pads and supports the solder balls during reflow.

3. The BGA of claim 2, wherein the WS flux is to clean the bond pads disposed on the substrate.

4. The BGA of claim 3, wherein the WS flux is the only flux applied to the bond pads.

5. The BGA of claim 1, wherein a remaining portion of the WS flux includes acid.

6. The BGA of claim 1, wherein the WS flux includes around 10% amine and around 17% bonding polymer.

7. The BGA of claim 1, wherein the WS flux is non-rosin based.

* * * * *